United States Patent [19]

Au et al.

[11] Patent Number: 5,543,650

[45] Date of Patent: Aug. 6, 1996

[54] ELECTROSTATIC DISCHARGE PROTECTION CIRCUIT EMPLOYING A MOSFET DEVICE

[75] Inventors: Wai-Ming W. Au; Minh H. Tong, both of Essex, Vt.

[73] Assignee: International Business Machines Corporation, Armonk, N.Y.

[21] Appl. No.: 587,809

[22] Filed: Jan. 5, 1996

Related U.S. Application Data

[63] Continuation of Ser. No. 371,626, Jan. 12, 1995, abandoned.

[51] Int. Cl.$^6$ ................................................. H01L 29/78
[52] U.S. Cl. ........................... 257/355; 257/361; 257/362; 327/432; 327/566
[58] Field of Search ................................. 257/355, 173, 257/361, 362

[56] References Cited

U.S. PATENT DOCUMENTS

| | | | |
|---|---|---|---|
| 4,760,433 | 7/1988 | Young et al. | 257/357 |
| 5,003,362 | 3/1991 | Lee et al. | 257/409 |
| 5,032,742 | 7/1991 | Zanders | 307/296.5 |
| 5,036,215 | 7/1991 | Masleid et al. | 257/353 |
| 5,148,250 | 9/1992 | Winnerl et al. | 257/361 |
| 5,229,635 | 7/1993 | Bessolo et al. | 257/360 |
| 5,291,051 | 3/1994 | Hoang et al. | 257/360 |

FOREIGN PATENT DOCUMENTS 6-177331  6/1994  Japan .

Primary Examiner—Robert P. Limanek
Assistant Examiner—David B. Hardy
Attorney, Agent, or Firm—Heslin & Rothenberg, P.C.

[57] ABSTRACT

An electrostatic discharge protection device for protecting the input of a circuit comprises a p-channel MOSFET (P-FET). The n-well with P+ implants of the P-FET provides a functional lateral PNP bipolar transistor that is coupled between the input of the circuit and a supply node of the circuit. Biasing circuitry controls biasing of the gate and n-well body of the P-FET in accordance with the voltage at the input of the circuit.

19 Claims, 4 Drawing Sheets

ELECTROSTATIC DISCHARGE PROTECTION CIRCUIT EMPLOYING A MOSFET DEVICE

This application is a continuation, of application Ser. No. 08/371,626 filed Jan. 12, 1995, now abandoned.

TECHNICAL FIELD

The present invention relates to an electrostatic discharge protection circuit and, more particularly, to an electrostatic discharge protection circuit employing a p-channel MOSFET.

BACKGROUND ART

Electrostatic discharge (ESD) refers to a phenomenon wherein a charged device of a given potential suddenly discharges carriers to a separate device of lower potential. The discharge occurs over a short time frame and, therefore, results in a momentary large current, if the resistance of the discharge path is kept low. For example, a human walking over a carpet in an environment of low humidity can collect electrostatic charge, and build up an electrostatic potential of several thousands volts. If the charged human touches a semiconductor device, an electrostatic discharge takes place from the human to elements of the semiconductor device. Such discharges can damage the semiconductor device unless means are provided for clamping the large voltages and diverting the currents resulting from the electrostatic discharge.

A known double diode protective circuit is shown in FIG. I wherein one diode 2 is tied between input terminal 16 and an upper supply voltage VDD of a semiconductor device and the other diode 4 is tied between the input terminal 16 and ground. When an input signal is received with a voltage potential greater than VDD, diode 2 turns on for clamping the excessive input signal to the upper supply VDD. Likewise, if the input signal received has a voltage potential less than ground i.e. −0.6 V, diode 4 turns on to clamp the excessive input signal to −0.6 V. The diodes assure that the input signal is clamped within a diode drop between ground and near VDD preventing excessive potentials from damaging circuitry of the semiconductor device beyond output terminal 18. However, the two diodes are not suitable for mixed voltage applications.

In mixed voltage interfacing applications, it is common for an input signal to have voltage levels greater than the positive supply of the receiving semiconductor device. For example, it may be required for a receiving device to convert input signals of 0 volts and 5 volts to output signals of 0 volts and 3 volts respectively. In such applications it is desirable to clamp the input between 0 volts and 5 volts instead of 0 volts and 3 volts, the levels of the receiving device. Thus, the input protection circuit should provide input limiting when the input voltage is in excess of 5 volts, which is 2 volts above the 3 volt positive supply of the receiving device. Zener type operation is desired wherein the input signal is clamped when it is at least 2 volts beyond the upper supply voltage of the receiving device.

With reference to FIG. 2, a known electrostatic discharge protection circuit comprises two shunting N-FETs (i.e. N channel MOSFETs) 10, 12 separated by a series resistor 14. The first FET 10 has it drain and gate connected to input terminal 16 and its source coupled to ground. Series resistor 14 is in a series path between input terminal 16 and output terminal 18 and separates the two shunting FETs 10 and 12.

The second FET 12 has its drain coupled to output terminal 18, and its source and gate coupled to ground. The insulating oxide layer for the gate of the first shunting FET 10 is thick while the oxide layer for the gate of the second shunting FET 12 is thin. The thick oxide provides the first FET a larger threshold voltage in contrast to the second FET. The threshold voltage for the first FET is set per the oxide thickness to be several volts above the positive supply of the semiconductor device. In contrast, the thin oxide for the second FET provides the FET a minimal threshold voltage and breakdown voltage so that it breaks down before the first FET turns on when a positive potential ESD event is applied to the input terminal. However, problems with the protection circuit of FIG. 2 concern a failure mode due to excessive power dissipation within the first and second shunting FETs, and process complexity in obtaining the desired threshold voltage for the first shunting FET 10.

For N-FET devices, when avalanche breakdown results, the electrons injected into a depletion region of a reverse biased function acquire sufficient energy to create new carriers when colliding with silicon atoms of the depletion region and a sudden increase in reverse leakage current results. Typical FET devices have sufficient drain and source resistance values (ballasting resistance) to provide voltage drops that stabilize the avalanche condition and reverse leakage current. However, with self-aligned silicide devices—wherein the gate, drain and source layers have self-aligned titanium heated with the silicon layers thereof to provide silicide of lower sheet resistance—the resistance values are much lower. However, the silicide sheet resistance can be non-uniform. With low, non-uniform resistance (minimal ballasting resistance) localized heating results in the depletion region of the reverse biased junction. The localized heating creates a bipolar positive feedback phenomenon wherein more carriers are generated in the depletion region to provide increased reverse current. As this process continues, thermal-run-away progresses until thermal damage results.

SUMMARY OF THE INVENTION

It is an object of the present invention to provide an improved electrostatic discharge protection circuit for protecting the input of a semiconductor device.

It is a further object of the present invention to provide an electrostatic discharge protection circuit compatible with mixed voltage interfacing requirements.

It is a further object of the present invention to provide an electrostatic discharge protection circuit that is robust and immune from latchup.

In accordance with the present invention, an electrostatic discharge protection device for a FET circuit includes an n-well of a P-channel MOSFET providing a functional lateral PNP bipolar transistor. The functional lateral PNP bipolar transistor is coupled between an input terminal and a positive voltage source of the FET circuit.

In accordance with one aspect of the present invention, a control means controls the gate and body bias potentials of the P-channel MOSFET. The control means provides a bias potential to the gate and body equal to the potential of the positive voltage source when the input terminal receives a voltage less than the potential of the positive voltage source. On the other hand, the control means provides a bias potential to the gate equal to the input voltage and a bias potential to the body equal to one diode drop below the input voltage, when the input voltage is greater than the potential of the positive voltage source.

BRIEF DESCRIPTION OF THE DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
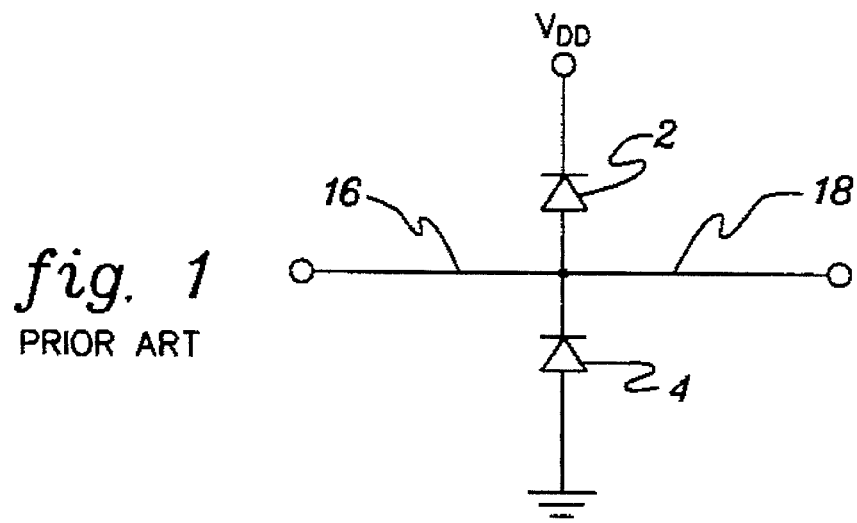
FIG. 1 is a schematic diagram illustrating a prior art double diode electrostatic discharge protective circuit.
Figure 2:
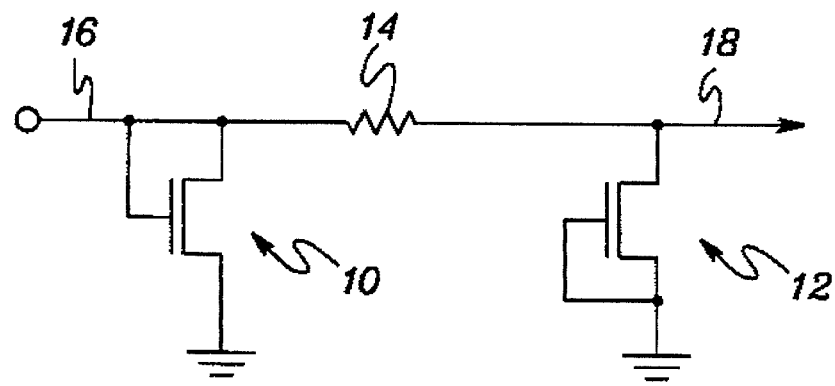
FIG. 2 is a schematic diagram illustrating a prior art electrostatic protection circuit employing a thick oxide FET, a resistor, and a thin oxide FET.
Figure 3:
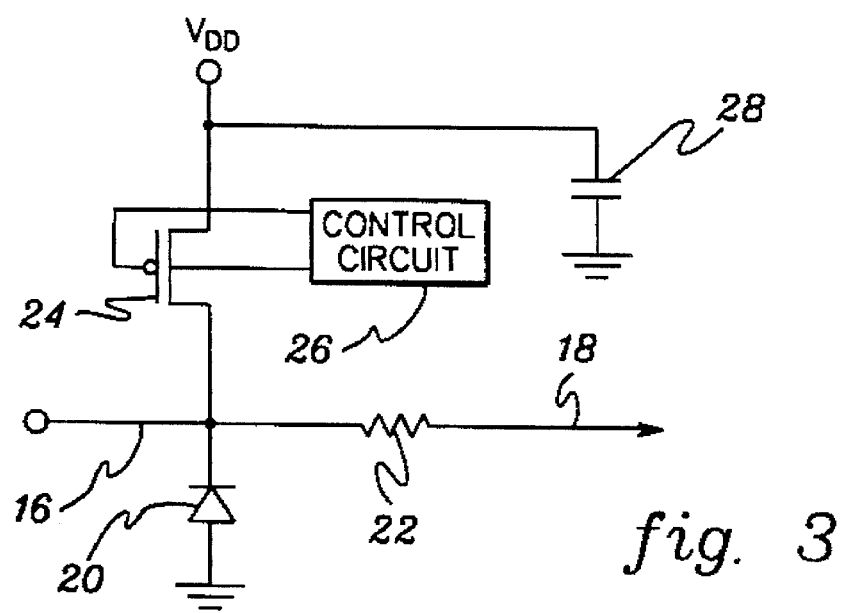
FIG. 3 is a simplified schematic diagram of the electrostatic discharge protective circuit in accordance with the present invention.

With reference to FIG. 3, an electrostatic protection circuit includes shunt and series circuit elements between input terminal 16 and output terminal 18. Diode 20 has it's cathode connected to input terminal 16 and it's anode coupled to ground. Resistor 22 is coupled between input terminal 16 and output terminal 18. P-FET 24 (i.e. p-channel MOSFET) has its drain coupled to input terminal 16 and its source connected to the positive voltage supply VDD. The gate and body of P-FET 24 are bias controlled by control circuit 26. A capacitor 28 decouples positive voltage supply VDD to ground. Control circuit 26 is operative for biasing the gate and the body (n-well 30 with reference to FIG. 4b) of the P-FET 24 to a potential equal to VDD when the input voltage received at terminal 16 is less than VDD. On the other hand, if the input voltage at terminal 16 exceeds VDD, control circuit 26 biases the gate of P-FET 24 to a potential equal to the input voltage and the body of P-FET 24 to a potential equal to the input voltage minus a diode voltage drop.

In another aspect of this embodiment, control circuitry 26 biases the gate and body of P-FET 24 to VDD when the input voltage is less than VDD and floats the gate and body of P-FET 24, as open circuits, when the input voltage exceeds VDD. Thus, when the input voltage at the input terminal 16 exceeds VDD, floating P-FET 24 is operative as a bipolar PNP transistor with a floating base as illustrated by FIGS. 4a and 4b.

Figure 4A:
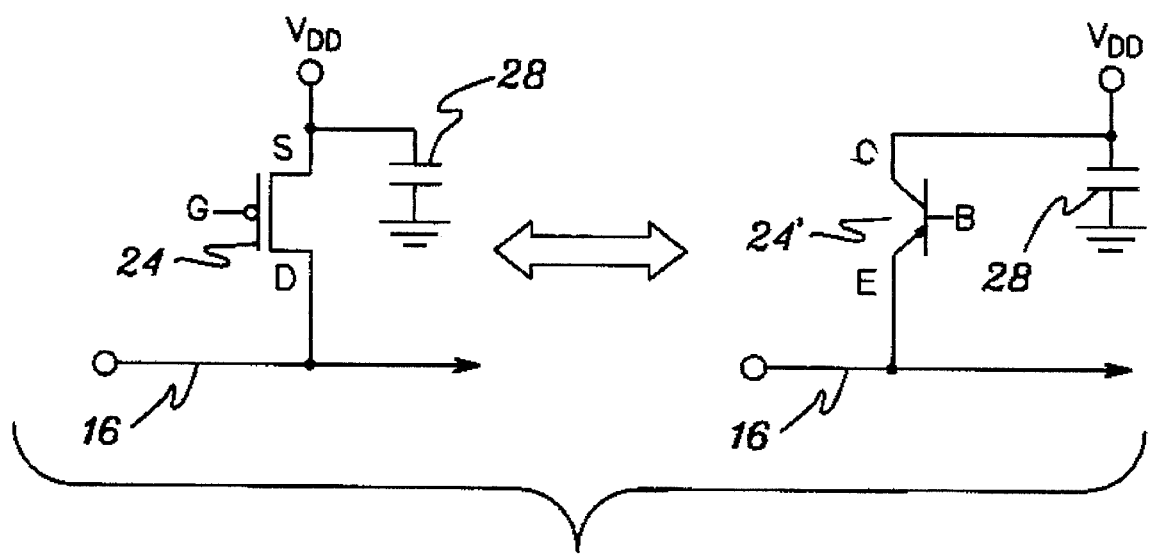
FIG. 4a is a schematic diagram showing the equivalence between a P-FET with floating gate and body, and a PNP bipolar transistor with floating base.
Figure 4B:
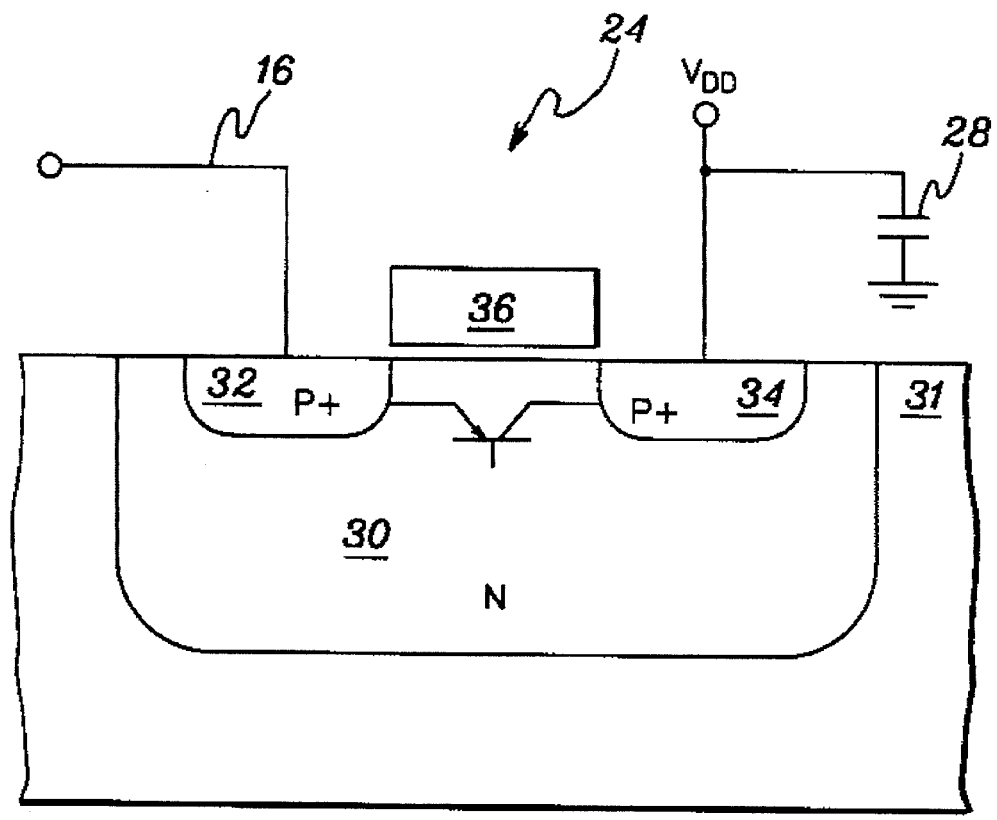
FIG. 4b is a cross section of the P-FET illustrating the lateral PNP bipolar transistor equivalent circuit within the n-well of the P-FET.

FIG. 4b shows a cross section of P-FET 24 wherein an n-well 30 is provided within a substrate 31. Two P-implants 32,34 in n-well 30 provide a drain and source respectively, for P-FET 24. In normal operation, the gate of the P-FET (P-channel MOSFET) would be biased beyond a given threshold for providing a p-channel through the n-well structure between the drain and source implant regions. However, in accordance with the present embodiment of the invention, when the input signal received at the input terminal 16 has a voltage potential greater than the positive supply VDD of the semiconductor device, the gate and body of the P-FET are floated wherein the P-FET can be modeled as a lateral bipolar PNP transistor. For example, P-implant 32 serves as an emitter, n-well 30 serves as a floating base, and P-implant 34 serves as a collector of the equivalent bipolar transistor.

FIG. 4a shows a bipolar equivalent circuit for a P-FET with its gate and body floating. When an ESD event reaches input terminal 16 with a magnitude well beyond VDD, the n-well and gate of the P-FET are floated and the equivalent bipolar device operates with floating base under a collector-to-emitter breakdown mode. The collector-to-emitter breakdown voltage $BV_{ceo}$, is given by:

$$BV_{ceo} = BV_{cbo}(1-a)^{1/n}$$

wherein $BV_{cbo}$ is the collector-to-base breakdown voltage, "a" is a collector efficiency typically ranging from 0.3 to 0.8, and "n" is equal to a constant ranging from 3 to 6.

By changing the design perimeters (i.e. channel length) for the P-FET, the collector-to-emitter breakdown characteristics for the intrinsic bipolar PNP transistor (of the P-FET's n-well) can be altered. In one embodiment of the present invention, a P-FET having a channel length of 0.9 micrometers provides the equivalent bipolar device with a collector-to-emitter breakdown voltage of 8 volts at a current level of 10 nano amps. The breakdown voltage however can be increased if the channel length of the FET is increased.

Figure 6A:
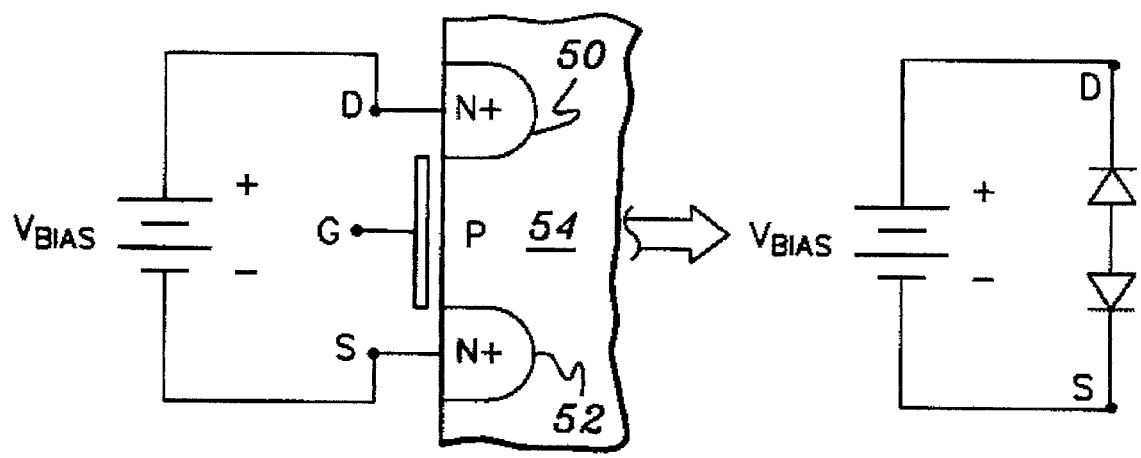
FIG. 6a is a cross sectional view and equivalent schematic diagram of an N-channel FET connected to a voltage supply.
Figure 6B:
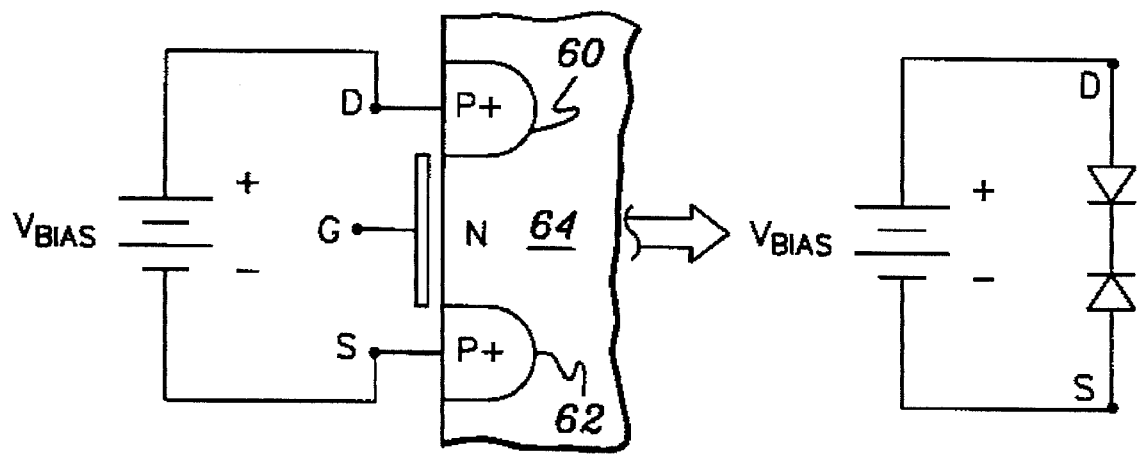
FIG. 6b is a cross sectional view and equivalent schematic diagram of a P-channel FET connected to a voltage supply.

As mentioned in the Background Art section, N-channel FETs in a breakdown condition can suffer thermal run-away as the device enters the avalanche condition, especially N-FETs having self aligned silicide drain and source metallization layers of low resistance. As best understood, an avalanche event in a depletion region of an N-FET is more extreme than an avalanche event in the depletion region of a P-FET. With reference to FIG. 6a, an N-FET has a P substrate 54 with two N+ implants 50, 52 for the drain and source respectively. If the gate is left floating and a bias voltage $V_{bias}$ applied between the drain and source, a depletion region develops at the interface of N+ implant 50 and P substrate 54, while the interface between P substrate 54 and N+ implant 52 behaves like a forward biased diode. As the voltage bias $V_{bias}$ is increased to the breakdown voltage, carriers are injected into the depletion region with sufficient energy to collide with silicon atoms in the depletion region and generate more carriers, i.e. avalanche multiplication of carriers. In contrast, with reference to FIG. 6b, a P-FET having N substrate 64 and two P+ implants 60, 62 biased similarly develops a depletion region between the interface of N substrate 64 and P+ implant 62. Due to a higher impact ionization rate, thermal-run-away in the depletion region of the N-FET occurs earlier than thermal-run-away in the depletion region of a P-FET. The depletion region of the N-FET, at the interface of N+ implant 50 and P substrate 54, is prone to more severe localized heating (as the avalanche process develops) than the depletion region of the P-FET, at the interface of N-substrate 64 and P+ implant 62. Thus, a P-FET device will be more robust under a positive potential avalanche breakdown condition than an N-FET device.

Figure 5:
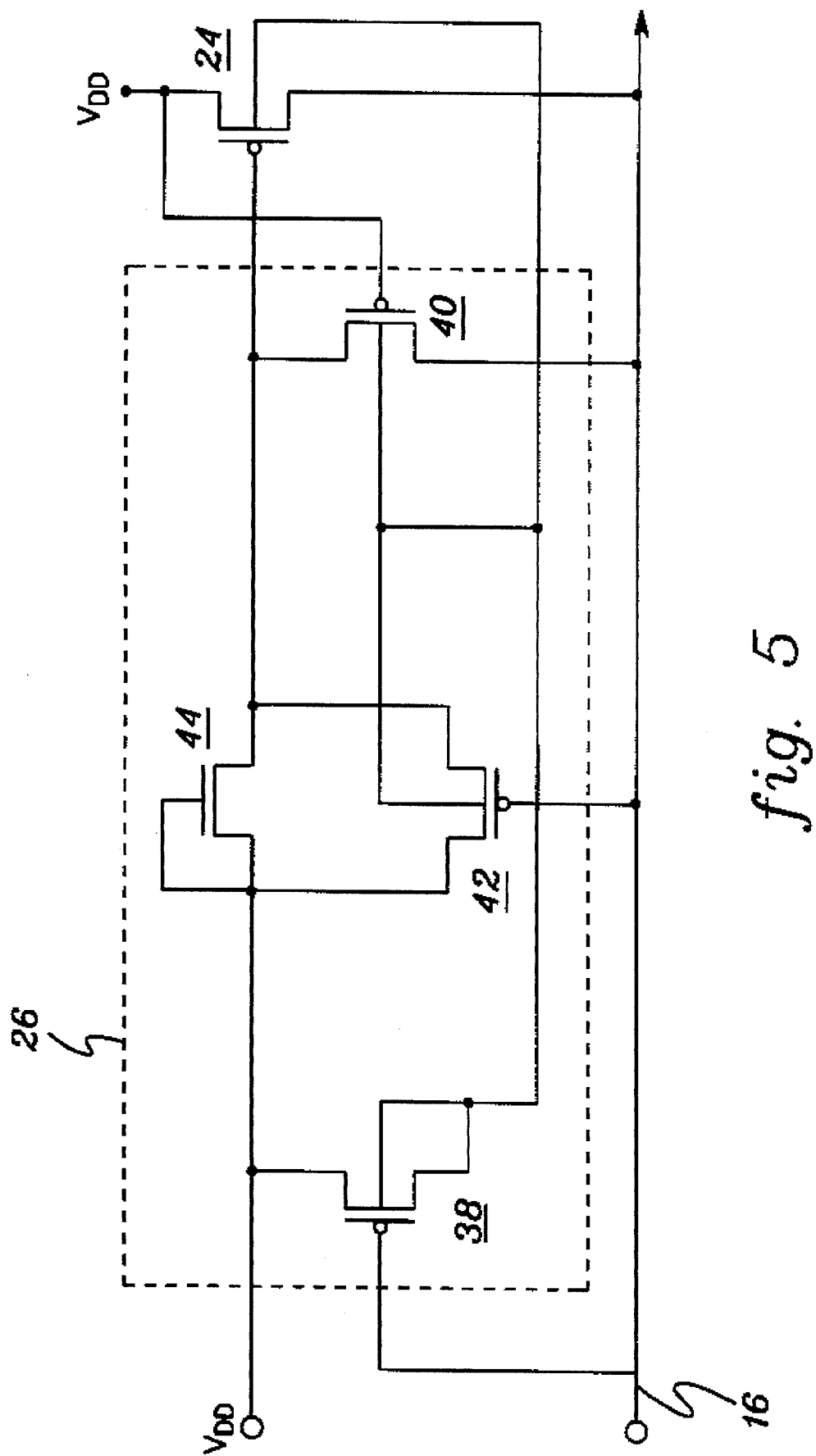
FIG. 5 is a schematic diagram of the electrostatic discharge protection circuit of the present invention including gate and body biasing circuitry.

In the preferred embodiment of the present invention, rather than floating the gate and body of P-FET 24 when a positive ESD potential is received, the gate is biased to a potential equal to the input voltage and the body is biased to one diode voltage drop below the input voltage. With reference to FIG. 5, P-FET 38 has its source coupled to the positive supply VDD, its gate coupled to the input, and its drain and body connected to the body of P-FET 24. N-FET 44 has its gate and drain connected to the positive supply VDD, and its source coupled to the gate of P-FET 24. P-FET 40 has its drain coupled to the gate of P-FET 24, its source coupled to input terminal 16, its gate connected to the positive supply VDD, and its body coupled to the body of P-FET 24. P-FET 42 has its source coupled to the positive supply VDD, its drain connected to the gate of P-FET 24, it's body connected to the body of P-FET 24, and it's gate connected to input terminal 16.

In operation, when the input voltage received at input terminal 16 is less than VDD, P-FET 38 is biased on for providing a potential of VDD at the body of P-FET 24. Similarly, P-FET 42 is biased on for providing a potential of VDD to the gate of P-FET 24. Note that transistors 44 and 40 are biased off.

In contrast, when the input potential received at the input terminal 16 is greater than VDD, P-FET 38 is biased off, along with P-FET 42. Instead, P-FET 40 is biased on to provide a positive potential at the gate of P-FET 24 equal to the input voltage. Similarly, the body of P-FET 24 is biased, per the body of P-FET 40, to a potential equal to the input voltage minus one diode voltage drop. Thus, when the input voltage is less than VDD, P-FET 24 is biased off with its gate and body biased to VDD, and when the input voltage received at input terminal 16 is greater than VDD, P-FET 24 remains biased off with its gate biased to a potential equal to the input voltage and its body biased to a potential equal to the input voltage minus one diode drop. By thus controlling the gate and body potentials, latchup immunity is provided.

To have good latchup immunity, one has to keep both the n-well and substrate resistances as low as possible. If the body (n-well) 30 of P-FET 24 were left completely floating during normal operating conditions, the n-well will behave like an infinite resistor which is detrimental to latchup protection. In accordance with the present invention, the body of P-FET 24 is bias controlled as the input signal received transitions to high and low levels. As a result, the possibility of latch up is prevented.

The n-well 30 with P+ implants 32, 34 of P-FET 24 provides a lateral bipolar PNP transistor having a collector-to-emitter breakdown establishing an upper voltage clamp for the input. For the circuit of FIG. 3, the voltage clamp occurs at a voltage equal to VDD plus the collector-to-emitter breakdown of the intrinsic bipolar transistor of P-FET 24. Note that the ESD protection circuit in accordance with the present invention is able to accommodate mixed voltage inputs. The input signal must present a voltage substantially beyond VDD (i.e. per the collector-to-emitter breakdown voltage) before being clamped by the protection circuit.

The collector-to-emitter breakdown voltage for the bipolar intrinsic transistor of P-FET 24 which provides the voltage clamp for the input signal is set in accordance with the channel geometries of P-FET 24. When P-FET 24 is fabricated on a semiconductor die together with other FETs to which electrostatic discharge protection is provided, it is easy to provide a special channel length for P-FET 24 (independent the channel lengths of the other FETs).

Finally, the width of the channel of P-FET 24 can be made great enough for handling a given power dissipation during an electrostatic discharge event. In addition, as described hereinbefore, the P-FET device offers a more robust input clamping device than an N-FET device. The P-FET, in accordance with the present invention, is less prone to thermal-run-away. As it enters an avalanche condition, it is able to establish a sustainable voltage condition before localized heating leads to thermal-run-away.

Providing a return current path to ground for electrostatic discharge events, an A. C. coupling capacitor 28 (with reference to FIG. 3) is coupled between the supply node VDD and ground.

While the invention has been particularly shown and described with reference to preferred embodiments thereof, it will be understood by those skilled in the art that various changes in form and detail may be made therein without departing from the spirit and scope of the invention.

What is claimed:

1. An electrostatic discharge protection device for an input of a circuit comprising:

a first P-FET having an n-well body including first and second P+ implants, and a gate, wherein said n-well with said first and second P+ implants provides a functional lateral PNP bipolar transistor coupled with said first P+ implant as an emitter and said second P+ implant as a collector thereof between said input and a supply node of said circuit; and active device means for variably controlling a bias voltage at said gate of said first P-FET.

2. An electrostatic discharge protection device according to claim 1 further comprising second active device means for controlling a bias voltage of the n-well body of said first P-FET.

3. An electrostatic discharge protection device according to claim 1, wherein said control means includes means for biasing the gate and the n-well body of said first P-FET to a voltage equal to a given voltage potential of said supply node when said input receives an input voltage less than said given voltage potential, and the gate to a voltage equal to said input voltage when said input voltage is greater than said given voltage potential of said supply node.

4. An electrostatic discharge protection device for an input of a circuit comprising:

a first P-FET having an n-well body including first and second P+ implants, and a gate, wherein said n-well with said first and second P+ implants provides a functional lateral PNP bipolar transistor coupled with said first P+ implant as an emitter and said second P+ implant as a collector thereof between said input and a supply node of said circuit; and active device means for controlling a bias voltage at said gate of said first P-FET wherein said active device means includes a second P-FET having its gate tied to said input, its source tied to said supply node and its body and drain coupled to the n-well body of said first P-FET.

5. An electrostatic discharge protection device according to claim 4 wherein said control means further comprises third and fourth P-FET's and an N-FET: a drain and a gate of said N-FET, a gate of said third P-FET and a source of said fourth P-FET being coupled to said supply node; a drain of said fourth P-FET being coupled to a drain of said third P-FET, a source of said N-FET and the gate of said first P-FET; bodies of both said third and said fourth P-FET's being coupled to the n-well body of said first P-FET; and a source of said third P-FET being coupled to said input and a gate of said fourth P-FET.

6. A electrostatic discharge protection device according to claim 4 wherein said control means further comprises third and fourth P-FETs; a source of said fourth P-FET and a gate of said third P-FET being coupled to said supply node; a drain of said third P-FET and a drain of said fourth P-FET being coupled to the gate of said first P-FET; a source of said third P-FET and a gate of said fourth P-FET being coupled to said input: and a body of said third P-FET and a body of said fourth P-FET being coupled to the n-well body of said first P-FET.

7. An electrostatic discharge protection device according to claim 1 wherein a length of a channel of said first P-FET is set in accordance with a desired voltage breakdown characteristic for said functional lateral PNP bipolar transistor.

8. An electrostatic discharge protection device for an input of a circuit comprising:

a first P-FET having an n-well body including first and second P+ implants, and a gate, wherein said n-well with said first and second P+ implants provides a functional lateral PNP bipolar transistor coupled with said first P+ implant as an emitter and said second P+ implant as a collector thereof between said input and a supply node of said circuit, wherein said supply node includes A.C. coupling to ground; and means for controlling a bias voltage at said gate of said first P-FET.

9. An electrostatic discharge protection device for an input of a circuit comprising:

a first P-FET having an n-well body including first and second P+ implants, and a gate, wherein said n-well with said first and second P+ implants provides a functional lateral PNP bipolar transistor coupled with said first P+ implant as an emitter and said second P+ implant as a collector thereof between said input and a supply node of said circuit; and means liar controlling a bias voltage at said gate of said first P-FET, said means for controlling including a second FET having its channel disposed serially between said gate of said first P-FET and said supply node.

10. An electrostatic discharge protection device for an input of a circuit comprising:

a first P-FET having an n-well body including first and second P+ implants, and a gate, wherein said n-well with said first and second P+ implants provides a functional lateral PNP bipolar transistor coupled with said first P+ implant as an emitter and said second P+ implant as a collector thereof between said input and a supply node of said circuit;

means for controlling a bias voltage at said gate of said first P-FET; and second means for controlling a bias voltage of the n-well body of said first P-FET, said second means comprising a second FET having its channel disposed serially between the n-well body of said first P-FET and said supply node.

11. An electrostatic discharge protection device for a mixed voltage interface to an input of a receiving circuit that receives a logic signal having an upper state voltage potential exceeding an upper supply voltage of said receiving circuit, said electrostatic discharge protection device comprising:

a P-FET, as a lateral PNP bipolar transistor, having its channel disposed electrically serially between said input and said upper supply voltage of said receiving circuit; and first control means for controlling a bias voltage at a gate of said P-FET, said first control means comprising an active device which variably controls the bias voltage at the gate of said P-FET.

12. An electrostatic discharge protection device according to claim 11 further comprising second control means for controlling a bias voltage at a body of said P-FET.

13. An electrostatic discharge protection device for a mixed voltage interface to an input of a receiving circuit that receives a logic signal having an upper state voltage potential exceeding an upper supply voltage of said receiving circuit, said electrostatic discharge protection device comprising:

a P-FET, as a lateral PNP bipolar transistor, having its channel disposed electrically serially between the input and the upper supply voltage of said receiving circuit; and first control means for controlling a bias voltage at a gate of said P-FET, wherein said first control means includes a first FET device having its channel disposed electrically serially between said upper supply voltage of said receiving circuit and said gate of said P-FET.

14. An electrostatic discharge protection device according to claim 13 wherein said second control means includes a second FET device having its channel disposed electrically serially between said upper supply voltage of said receiving circuit and said body of said P-FET.

15. An electrostatic discharge protection device according to claim 14 wherein a gate of said second FET device is coupled to said input.

16. An electrostatic discharge protection device for a mixed voltage interface to an input of a receiving circuit that receives a logic signal having an upper state voltage potential exceeding an upper supply voltage of said receiving circuit, said electrostatic discharge protection device comprising:

a P-FET, as a lateral PNP bipolar transistor, having its channel disposed electrically serially between said input and said upper supply voltage of said receiving circuit; and first control means for controlling a bias voltage at a gate of said P-FET, wherein said first control means includes a first FET device having its channel disposed electrically serially between said upper supply voltage of said receiving circuit and said gate of said P-FET.

17. An electrostatic discharge protection device according to claim 16 wherein said first control means further comprises a second FET device having its channel disposed between said input and said gate of said P-FET.

18. An electrostatic discharge protection device according to claim 17 wherein a gate of said second FET device is coupled to said upper supply voltage of said receiving circuit.

19. An electrostatic discharge protection device for an input of a circuit comprising:

a first P-FET having an n-well body including first and second P+ implants, and a gate, wherein said n-well with said first and second P+ implants provides a functional lateral PNP bipolar transistor coupled with said first P+ implant as an emitter and said second P+ implant as a collector thereof between said input and a supply node of said circuit; and means for controlling a bias voltage at said gate of said first P-FET, said bias voltage provided by said means for controlling comprising an active voltage which is variably controlled by said means for controlling.

* * * * *

UNITED STATES PATENT AND TRADEMARK OFFICE
CERTIFICATE OF CORRECTION

PATENT NO.: 5,543,650

DATED: Aug. 6, 1996

INVENTOR(S): Au et al.

It is certified that error appears in the above-identified patent and that said Letters Patent is hereby corrected as shown below:

Column 1, line 32, delete "I" and substitute therefor --1--.

Column 7, line 36, delete "liar" and substitute therefor --for--.

Signed and Sealed this

Eighteenth Day of February, 1997

Attest:

BRUCE LEHMAN

*Attesting Officer*　　　　*Commissioner of Patents and Trademarks*